United States Patent
Fan

(10) Patent No.: US 8,019,295 B2
(45) Date of Patent: Sep. 13, 2011

(54) TRANSMITTING POWER LEVEL CONTROLLER AND RELATED METHOD

(75) Inventor: Sheng-Po Fan, Hsinchu County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 627 days.

(21) Appl. No.: 12/145,513

(22) Filed: Jun. 25, 2008

(65) Prior Publication Data

US 2009/0325517 A1 Dec. 31, 2009

(51) Int. Cl.
*H01Q 11/12* (2006.01)

(52) U.S. Cl. .... 455/127.2; 455/69; 455/522; 455/127.1; 455/226.1; 455/115.1; 330/278; 330/285

(58) Field of Classification Search ............... 455/127.2, 455/69, 522, 127.1, 226.1, 115.1; 330/278, 330/285
See application file for complete search history.

(56) References Cited

U.S. PATENT DOCUMENTS

| 7,808,322 B1* | 10/2010 | Son et al. ..................... 330/278 |
| 2004/0162104 A1* | 8/2004 | Ozluturk et al. ........... 455/550.1 |
| 2006/0084391 A1* | 4/2006 | Chmiel ........................... 455/69 |

* cited by examiner

*Primary Examiner* — Sanh Phu
(74) *Attorney, Agent, or Firm* — Winston Hsu; Scott Margo

(57) ABSTRACT

A transmitting power level controller of a communication system includes a radio-frequency unit for generating a communication signal and a power amplifier for amplifying the communication signal to generate a transmitting signal. The transmitting power level controller has a temperature sensor, a power detector, and an automatic level controller. The temperature sensor senses temperature of at least one of the RF unit and the PA to generate a detected temperature signal. The power detector detects a transmitting power of the transmitting signal to generate a detected power signal. The automatic level controller is coupled to the temperature sensor and the power detector. The power detector adjusts the transmitting power of the transmit signal according to the detected power signal when a maximal transmitting power is in a predetermined range, and adjusts the transmitting power according to the detected temperature signal otherwise.

22 Claims, 4 Drawing Sheets

TRANSMITTING POWER LEVEL CONTROLLER AND RELATED METHOD

BACKGROUND

The invention relates to a method and an apparatus for controlling transmitting power of a communication system, and more particularly, to an automatic level controller for a WiMAX system and a related method thereof.

In a communication system, the signal to noise ratio (SNR) is an important indicator of the transmission quality of the communication system. General method for improving the SNR is to increase the power of transmitted signals. This method, however, does not normally work well in wireless communications, especially under a condition where many users utilize adjacent frequency bands in a small area (e.g. in a communication cell) at the same time. This is because a first signal of large power might become a significant interference source for a second signal adjacent to the first signal in a frequency band. Although the SNR for the first signal is improved, the SNR for the second signal is degraded. Hence, wireless communication systems, e.g. WiMAX systems and CDMA systems, etc., usually define a maximum allowed transmitting power for each user. In this way, signals in a wireless communication system will not interfere with each other.

For a transmitter, a target transmitting power of a signal is well calculated, and is carried out by the coordination of elements of the transmitter wherein the element having the biggest influence is (for example) a power amplifier (PA) of the transmitter. The PA amplifies power of a radio-frequency (RF) signal to be transmitted and feeds the amplified RF signal to an antenna of the transmitter. The characteristics of the PA, however, vary with many non-ideal effects, e.g. component aging and surrounding temperature variation, etc. This results in a deviated actual transmitting power that is different from the target transmitting power. The deviation can result in the actual transmitting power surpassing the target transmitting power, and furthermore, surpassing the maximum allowed transmitting power of the wireless communication system. A significant interference for other users will therefore occur.

SUMMARY

To solve the above-mentioned problems, one objective of the invention is to provide an apparatus and method for wireless communication systems to automatically adjust a transmitting power level.

According to an exemplary embodiment of the invention, a transmitting power level controller of a communication system is disclosed. The communication system comprises a radio-frequency (RF) unit for generating a communication signal and a power amplifier (PA) for amplifying the communication signal to generate a transmitting signal. The transmitting power level controller comprises a temperature sensor, a power detector, and an automatic level controller. The temperature sensor senses the temperature of at least one of the RF unit and the PA in order to generate a detected temperature signal. The power detector detects a transmitting power of the transmitting signal in order to generate a detected power signal. The automatic level controller is coupled to the temperature sensor and the power detector. The power detector adjusts the transmitting power of the transmitting signal according to the detected power signal when a maximal transmitting power is in a predetermined range, and adjusts the transmitting power according to the detected temperature signal otherwise.

According to an exemplary embodiment of the invention, a method for adjusting a transmitting power level of a communication system is disclosed. The communication system comprises a radio-frequency (RF) unit for generating a communication signal and a power amplifier (PA) for amplifying the communication signal to generate a transmitting signal. The method comprises the following steps: sensing temperature of at least one of the RF unit and the PA to generate a detected temperature signal; detecting a transmitting power of the transmitting signal to generate a detected power signal; and adjusting the transmitting power of the transmitting signal according to the detected power signal when a maximal transmitting power is in a predetermined range, and adjusting the transmitting power according to the detected temperature signal otherwise.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
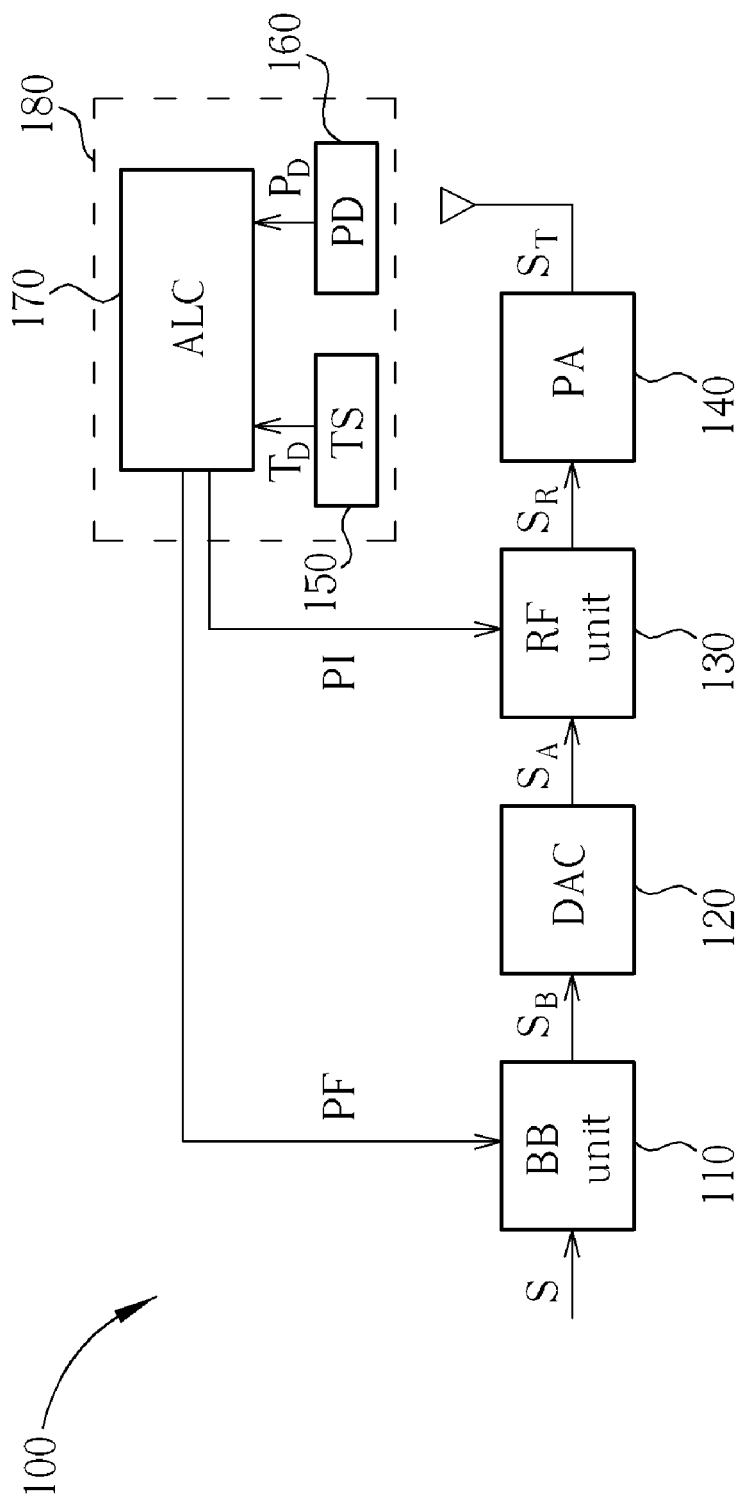
FIG. 1 is a block diagram of a communication system comprising a transmitting power level controller according to an embodiment of the invention.

FIG. 1 is a block diagram of a communication system comprising a transmitting power level controller according to an embodiment of the invention. Note that only components pertinent to technical features of the invention are shown in FIG. 1. Therefore, only a baseband (BB) unit 110, a digital-to-analog converter (DAC) 120, a radio-frequency (RF) unit 130, a power amplifier (PA) 140, and a transmitting power level controller 180 are shown, while other well-known components of the communication system 100 are omitted for brevity. The communication system 100 can be a transmitter of a wireless communication system. In this embodiment, the communication system 100 is a transmitter of a mobile station of a WiMAX system. The transmitting power level controller 180 comprises a temperature sensor (TS) 150, a power detector (PD) 160, and an automatic level controller (ALC) 170.

The BB unit 110 receives an incoming signal S and generates a baseband signal $S_B$ according to a baseband gain. The DAC 120 converts the baseband signal $S_B$ to an analog signal $S_A$ according to a DAC gain. The RF unit 130 converts the analog signal $S_A$ to a RF signal $S_R$ according to a RF gain. The PA 140 amplifies power of the RF signal $S_R$ to generate a transmit signal $S_T$ according to a PA gain.

As illustrated above, an actual transmitting power of the transmitting signal $S_T$ will deviate from a target transmitting power due to the characteristics of the PA 140 varying with non-ideal effects. For solving the problem, the ALC 170 is implemented to allow the transmitter 100 to transmit the transmitting signal $S_T$ at the output of the PA 140 with accurate power and without violating regulatory requirements. In other words, the ALC 170 calibrates the transmitting power of the transmitting signal $S_T$. In an embodiment of the invention, the ALC 170 provides two operation modes for calibrating the signal power. The two operation modes switches according to a maximal transmit power $P_{MAX}$. In one embodiment, the maximal transmitting power indicates power of a symbol having maximal power in a frame of the transmitting signal $S_T$. In other embodiments, the maximal transmitting power $P_{MAX}$ can indicate power of a symbol having maximal power in a frame of the RF signal $S_R$, the analog signal $S_A$ or the baseband signal $S_B$. The maximal transmitting power $P_{MAX}$ can be calculated by a transmitting power controller (not shown in FIG. 1). The transmitting power controller calculates the power of each symbol of each frame of the transmitting signal $S_T$. In other words, the transmitting power controller determines a target power of the transmitting signal $S_T$. In addition, the maximal transmitting power $P_{MAX}$ can also be detected.

In a first mode (i.e., a high power mode), when the maximal transmitting power $P_{MAX}$ of the transmitting signal $S_T$ is in a predetermined range, e.g. higher than a threshold, the transmitting power should be strictly controlled. The ALC 170 therefore calibrates the transmitting power according to a detected power signal $P_D$ that is detected in every frame of the transmitting signal $S_T$ by the PD 160. The PD 160 can be embedded in the PA 140, and the ALC 170 can directly obtain the detected power signal $P_D$ via a pin of the PA 140.

In a second mode (i.e., a low power mode), when the maximal transmitting power $P_{MAX}$ is not in a predetermined range, e.g. lower than the threshold, the ALC 170 calibrates the transmitting power according to a detected temperature signal $T_D$ that is detected every minute by the TS 150. The TS 150 (e.g. a thermistor) can be allocated around the RF unit 130 and the PA 140, and senses temperature of at least one of the RF unit 130 and the PA 140 to generate the detected temperature signal $T_D$.

The ALC 170 can calibrate the transmitting power of the transmitting signal $S_T$ by adjusting the baseband gain, the DAC gain, the RF gain, the PA gain, or a combination thereof. In one embodiment, the ALC 170 adjusts the baseband gain and the RF gain to calibrate the transmitting power. The detailed adjusting procedure will be described in the following.

Figure 2:
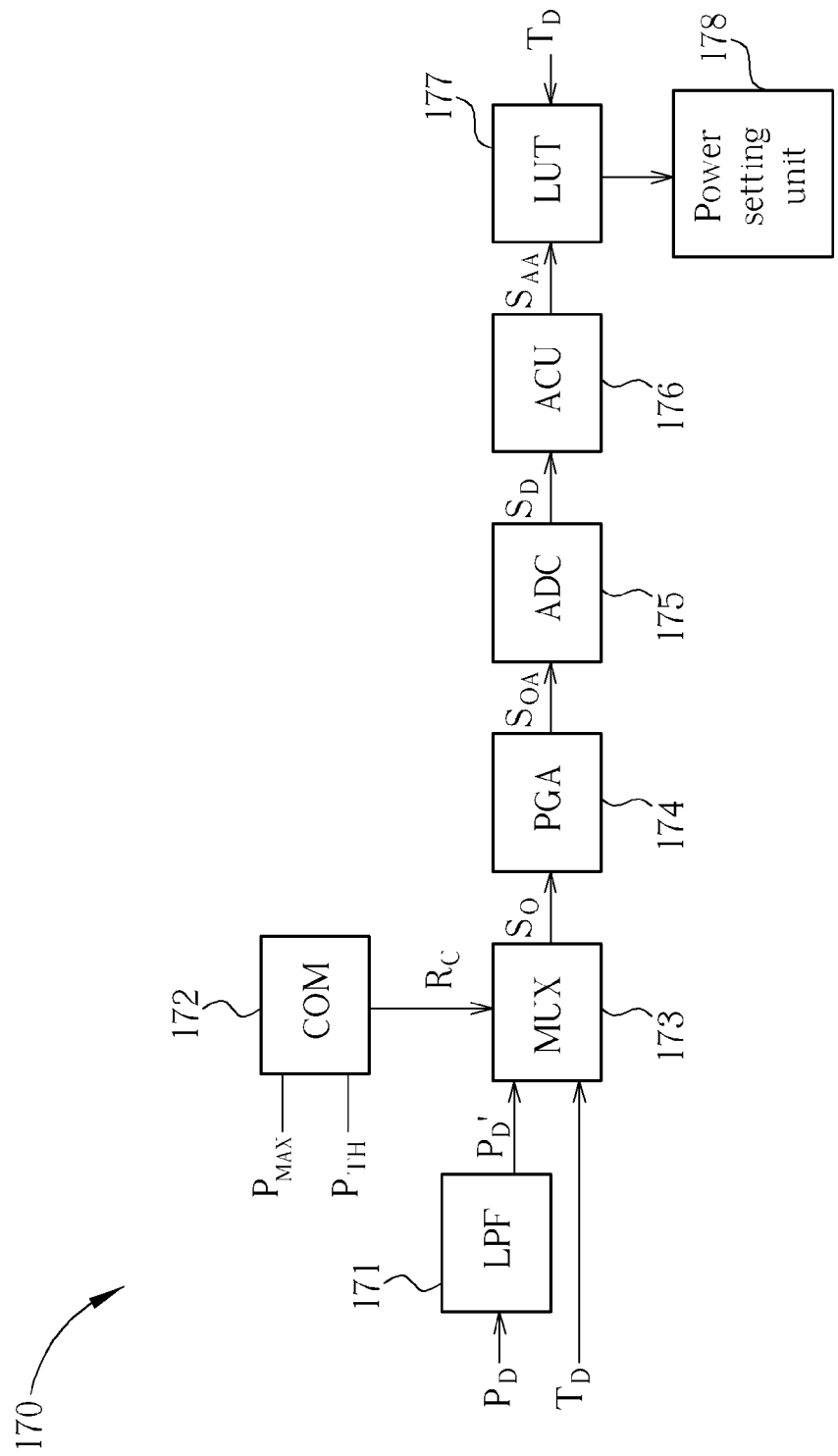
FIG. 2 is a block diagram of an automatic level controller shown in FIG. 1.

For accurately calibrating the transmitting power of the transmitting signal $S_T$, the adjusting procedure can be implemented in the digital domain. FIG. 2 is a block diagram of the ALC 170 shown in FIG. 1. The ALC 170 comprises a low pass filter (LPF) 171, a comparator (COM) 172, a multiplexer (MUX) 173, a programmable gain amplifier (PGA) 174, an analog-to-digital converter (ADC) 175, an accumulator (ACU) 176, a look-up table (LUT) 177, and a power setting unit 178. For determining the operation mode of the ALC 170, the COM 170 compares the maximal transmitting power $P_{MAX}$ and a threshold $P_{TH}$ to generate a comparison result $R_C$ to control the MUX 173. When the comparison result $R_C$ indicates that the maximal transmitting power $P_{MAX}$ is higher than the threshold $P_{TH}$, the ALC 170 should operate in the aforementioned high power mode. Otherwise, when the comparison result $R_C$ indicates that the maximal transmitting power $P_{MAX}$ is lower than the threshold $P_{TH}$, the ALC 170 should operate in the aforementioned low power mode.

In the high power mode, the MUX 173 outputs a smoother detected power signal $P_D'$ as an output signal $S_O$ to the PGA 174 according to the comparison result $R_C$. The LPF 171 is coupled to the PD 160 and filters out high frequency components of the detected power signal $P_D$ to generate the smoother detected power signal $P_D'$. The RC time constant of the LPF 171 can be designed to be around $2e^{-5}$, and the settling time is about one symbol duration of the transmit signal $S_T$. The LPF 171 is an optional component. For example, in an alternative design, the LPF 171 can be omitted, and the MUX 173 directly outputs the detected power signal $P_D$ as the output signal $S_O$ to the PGA 174. In the low power mode, the MUX 173 outputs the detected temperature signal $T_D$ as the output signal $S_O$ to the PGA 174 according to the comparison result $R_C$. As illustrated above, the detected temperature signal TD can be generated from sensing the temperature of the RF unit 130 or the PA 140.

In order to utilize the input range of the ADC 175 adequately, the PGA 174 is adopted. The PGA 174 is coupled to the MUX 173, and amplifies the output signal $S_O$ to generate an amplified output signal $S_{OA}$ according to the input range of the ADC 175. The ADC 175 is coupled to the PGA 174, and converts the amplified output signal $S_{OA}$ to a digital output signal $S_D$. In order to obtain enough samples and a sufficient resolution, the ADC 175 can operate at 1.4 MHz sampling rate and generate an 8-bit digital output signal $S_D$. The ACU 176 is coupled to the ADC 175 and is used to calculate an average value of samples of the digital output signal $S_D$. For example, the ACU 176 generates an accumulation signal $S_{AA}$ by accumulating 128 samples of the digital output signal $S_D$ sequentially. The digitized accumulation signal $S_{AA}$ is an accurate value representing the detected power of the PA 140 or the detected temperature of the PA 140 or the RF unit 130. For the following power setting procedure, the accumulation signal $S_{AA}$ should be converted to a measured value $S_M$ representing a measured power or a measured temperature.

For example, in the high power mode, the range of the accumulation signal $S_{AA}$ is from 0.5V to 2.4V, and the LUT 177 correspondingly converts the accumulation $S_{AA}$ to the measured power having a range from 16 dBm to 34 dBm according to characteristics of the PA 140. The LUT 177 therefore can be built according to the specification of the PA 140. For more accurately converting the measured power, the temperature issue should be taken into consideration. The PA 140 operating under a working temperature of 30° C. has characteristics different from that of the PA 140 operating under a working temperature of 80° C. Hence, when the LUT 177 converts the accumulation signal $S_{AA}$ to the measured power, the detected temperature signal $T_D$ detected in the final minute should be taken into consideration. For example, when the detected temperature signal $T_D$ indicates that the PA 140 is operating under a working temperature of 30° C., the LUT 177 converts a 1V accumulation signal $S_{AA}$ to a 22 dBm measured power, and when the detected temperature signal $T_D$ indicates that the PA 140 is operating under a temperature of 80° C., the LUT 177 converts the 1V accumulation signal $S_{AA}$ to a 25 dBm measured power.

In the low power mode, the range of the accumulation signal $S_{AA}$ is from 2.4V to 0.5V, and the LUT 177 correspondingly converts the accumulation $S_{AA}$ to the measured temperature having a range from −40° C. to 85° C. When the TS 150 is located near the PA 140, the measured temperature is indicating the temperature of the PA 140. When the TS 150 is located near the RF unit 130, the measured temperature is indicating the temperature of the RF unit 130. If the RF unit 130 and PA 140 are located in the vicinity, the measured temperature can indicate temperature of both the RF unit 130 and PA 140. Basically, temperature of the PA 140 is a dominant factor for calibrating the transmitting power.

Figure 3:
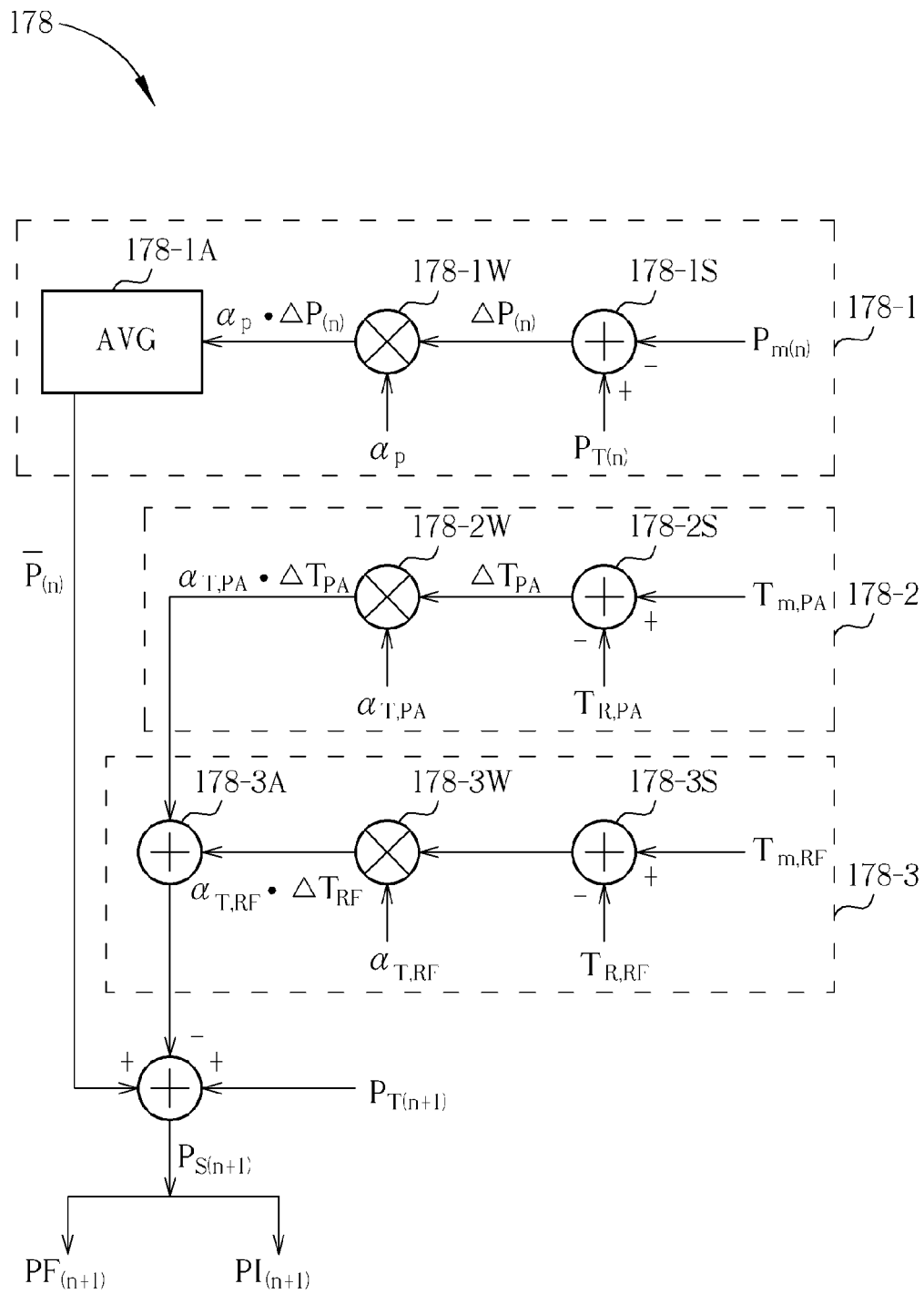
FIG. 3 is a diagram illustrating an embodiment of a power setting unit shown in FIG. 2.

The measured temperature or measured power is then fed to the power setting unit 178 for determining an accurate power correction factor of transmit power. FIG. 3 is a diagram illustrating an embodiment of the power setting unit 178 shown in FIG. 2. The power setting unit 178 comprises three portions. The first portion 178-1 is mainly used in high power mode, and the second portion 178-2 and third portion 178-3 are mainly used in low power mode. Detailed operations thereof will be described in the following.

Figure 4:
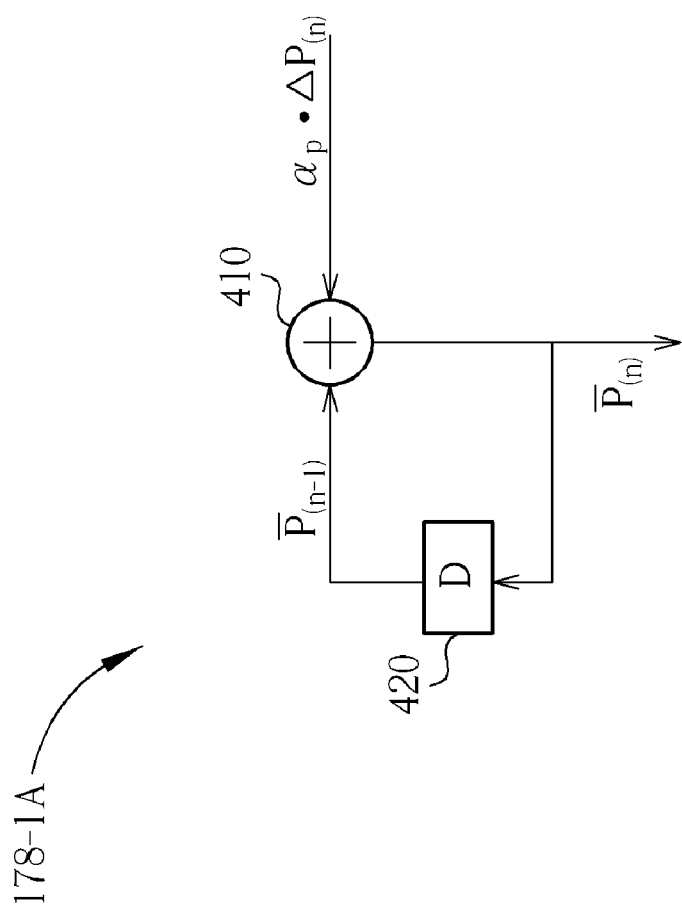
FIG. 4 is a diagram illustrating an embodiment of an average unit shown in FIG. 3.

In the high power mode, the transmitting power measurement and calibration are made symbol by symbol. The target power $P_{T(n)}$ determined by the transmitting power controller indicates target power of $n^{th}$ symbol of the transmitting signal. As illustrated above, due to some non-ideal effects, a real transmitting power deviates from the target transmitting power. The measured power $P_{m(n)}$ reflecting the real transmitting power therefore indicates measured power of $n^{th}$ symbol of the transmitting signal. To find out the difference between the real transmitting power and target transmitting power, a subtracting unit 178-1S subtracts the measured power $P_{m(n)}$ from the target power $P_{T(n)}$ to generate a power error $\Delta P_{(n)}$. Then, a weighting unit 178-1W multiplies the power error $\Delta P_{(n)}$ with a power weighting factor $\alpha_P$ to generate a weighted power error $\alpha_P \cdot \Delta P_{(n)}$. The $n^{th}$ weighted power error $\alpha_P \cdot P_{(n)}$ can be averaged with a previous weighted power error $\alpha_P \cdot \Delta P_{(n)}$, e.g. $(n-1)^{th}$ weighted power error $\alpha_P \cdot \Delta P_{(n-1)}$, $(n-2)^{th}$ weighted power error $\alpha_P \cdot \Delta P_{(n-2)}$, and $(n-3)^{th}$ weighted power error $\alpha_P \cdot \Delta P_{(n-3)}$, etc. An average unit (AVG) 178-1A generates an average power difference $\overline{P}_{(n)}$ by averaging the output signal of the weighting unit 178-1W. FIG. 4 is a diagram illustrating an embodiment of the AVG 178-1A shown in FIG. 3. The AVG 178-1A comprises an adder 410 and a delay unit 420. The adder 410 sums up the $n^{th}$ weighted power error $\alpha_P \cdot \Delta P_{(n)}$ and the $(n-1)^{th}$ average power difference $\overline{P}_{(n-1)}$ generated by the delay unit 420 to generate the $n^{th}$ average power difference $\overline{P}_{(n)}$. The $n^{th}$ average power difference $\overline{P}_{(n)}$ is the power correction factor for the next symbol, i.e. $(n+1)^{th}$ symbol. The $n^{th}$ average power difference $\overline{P}_{(n)}$ is added to the target transmitting power of $(n+1)^{th}$ symbol $PT_{(n+1)}$ to generate a setting power $P_{S(n+1)}$ for $(n+1)^{th}$ symbol. The setting power $P_{S(n+1)}$ that has been corrected by considering a previous measured power is utilized to set the transmitting power of the transmitting signal. The power deviations, therefore, can be eased or eliminated by the proposed automatic transmitting power level adjusting technique. In addition, the setting power $P_{S(n+1)}$ can be divided into two parts, a major part $PI_{(n+1)}$ and a minor part $PF_{(n+1)}$. For example, the major part $PI_{(n+1)}$ is power setting information in integral dB, and the minor part $PF_{(n+1)}$ is power setting information in fractional dB. The minor part $PF_{(n+1)}$ can be utilized to adjust the baseband gain of the BB unit 110, while the major part $PI_{(n+1)}$ can be utilized to adjust the RF gain of the RF unit 130.

In the low power mode, the temperature measurement is made every minute, and the transmitting power calibration is made every symbol. Taking the second unit 178-2 as an example, a reference PA temperature $T_{R,PA}$ indicates a reference temperature or normal operation temperature for the PA 140. The measured PA temperature $T_{m,PA}$ generated by the LUT 177 reflects the real operation temperature of the PA 140. When the PA 140 operates under the normal operation temperature, the real transmitting power will be substantially the same as the target transmitting power. When the PA 140 operates under a temperature greatly different from the normal operation temperature, this will cause the real transmitting power to be greatly different from the target transmitting power. The difference between the real operation temperature and reference temperature can be utilized to correct the setting of the transmitting power. The subtracting unit 178-2S subtracts the reference PA temperature $T_{R,PA}$ from the measured PA temperature $T_{m,PA}$ to generate the PA temperature difference $\Delta T_{PA}$. The weighting unit 178-2W multiplies the PA temperature difference $\Delta T_{PA}$ with a PA temperature weighting factor $\alpha_{T,PA}$ to convert the temperature difference $\Delta T_{PA}$ to a weighted PA temperature difference $\alpha_{T,PA} \cdot \Delta T_{PA}$ for correcting the power setting of the transmitting power. The PA temperature weighting factor $\alpha_{T,PA}$ is determined according to characteristics of the PA 140, and can be obtained from experiments or specification of the PA 140. The weighted PA temperature difference $\alpha_{T,PA} \cdot \Delta T_{PA}$ is subtracted from the target transmitting power of the $(n+1)^{th}$ symbol $PT_{(n+1)}$ to generate the setting power $P_{S(n+1)}$ for the $(n+1)^{th}$ symbol. The setting power $P_{S(n+1)}$ that has been corrected by considering a previous measured PA temperature is utilized to set the transmitting power of the transmitting signal. The power deviations, therefore, can be eased or eliminated.

The operation of the third unit 178-3 is similar to the second unit 178-2, except for the processed terms having different meanings. A reference RF temperature $T_{R,RF}$ indicates a reference temperature or normal operation temperature for the RF 130. The measured RF temperature $T_{m,RF}$ generated by the LUT 177 reflects a real operation temperature of the RF 140. The RF temperature weighting factor $\alpha_{T,RF}$ is determined according to characteristics of the RF unit 130, and can be obtained from experiments or specification of the RF unit 130. The weighted RF temperature difference $\alpha_{T,RF} \cdot \Delta T_{RF}$ is subtracted from the target transmitting power of $(n+1)^{th}$ symbol $PT_{(n+1)}$ to generate the setting power $P_{S(n+1)}$ for $(n+1)^{th}$ symbol. The setting power $P_{S(n+1)}$ that has been corrected by considering a previous measured PA temperature is utilized to set the transmitting power of the transmitting signal.

Please note that when the TS 150 is located near the PA 140 and the RF unit 130, the measure temperature generated by the LUT 177 can reflect the real operation temperature of the PA 140 and the RF unit 130 at the same time. In other words, the LUT 177 can provide the measured PA temperature $T_{m,PA}$ and the measured RF temperature $T_{m,RF}$ having the same value as the measured PA temperature $T_{m,PA}$ to the second unit 178-2 and the third unit 178-3. The influence of the PA and RF temperature variation can be combined for correcting the setting of the transmitting power. The weighted RF temperature difference $\alpha_{T,RF} \cdot \Delta T_{RF}$ and the weighted PA temperature difference $\alpha_{T,RF} \cdot \Delta T_{PA}$ are therefore summed up by the adder 178-3A, and the output of the adder 178-3A is subtracted from the target transmitting power of the $(n+1)^{th}$ symbol $PT_{(n+1)}$ to generate the setting power $P_{S(n+1)}$ for the $(n+1)^{th}$ symbol. The setting power $P_{S(n+1)}$ that has been corrected by considering a previous measured PA and RF temperature is utilized to set the transmitting power of the transmitting signal.

In addition, the first unit 178-1, second unit 178-2, and third unit 178-3 can be utilized to correct the setting of the transmitting power independently or in combination. People skilled in the art will readily appreciate the combinational uses of these three units through the teachings of the above embodiments, therefore detailed descriptions thereof are omitted for brevity.

According to the embodiments of the invention, an apparatus and method for automatically adjusting a transmitting power level of a wireless communication system are provided. The detected transmitting power issue and the PA and RF transmitting issue are taken into consideration for correcting the setting of the transmitting power. Hence, transmitting power deviation can be avoided or alleviated.

Those skilled in the art will readily observe that numerous modifications and alterations of the device and method may be made while retaining the teachings of the invention.

What is claimed is:

1. A transmitting power level controller of a communication system, the communication system comprising a radio-frequency (RF) unit for generating a communication signal and a power amplifier (PA) for amplifying the communication signal to generate a transmitting signal, the transmitting power level controller comprising:
    a temperature sensor, for sensing temperature of at least one of the RF unit and the PA to generate a detected temperature signal;
    a power detector, for detecting a transmitting power of the transmit signal to generate a detected power signal; and
    an automatic level controller, coupled to the temperature sensor and the power detector, for adjusting the transmitting power of the transmitting signal according to the detected power signal when a maximal transmitting power is in a predetermined range, and adjusting the transmitting power according to the detected temperature signal when the maximal transmitting power is not in the predetermined range.

2. The transmitting power level controller of claim 1 wherein the automatic level controller comprises a power setting unit comprising:
    a subtracting unit, for generating a difference according to the detected power signal and a target transmitting power; and
    a weighting unit, coupled to the subtracting unit, for generating a weighted difference according to the difference;
    wherein the automatic level controller adjusts the transmitting power according to the weighted difference.

3. The transmitting power level controller of claim 2 wherein the power setting unit further comprises:
    an average unit, coupled to the weighting unit, for generating an average difference according to an output signal of the weighting unit;
    wherein the automatic level controller adjusts the transmitting power according to the average difference.

4. The transmitting power level controller of claim 1 wherein the temperature sensor senses temperature of the PA to generate the detected temperature signal, and the automatic level controller comprises a power setting unit comprising:
    a subtracting unit, for generating a difference according to the detected temperature signal and a reference PA temperature; and
    a weighting unit, coupled to the subtracting unit, for generating a weighted difference according to the difference;
    wherein the automatic level controller adjusts the transmitting power according to the weighted difference.

5. The transmitting power level controller of claim 1 wherein the temperature sensor senses temperature of the RF unit to generate the detected temperature signal, and the automatic level controller comprises a power setting unit comprising:
    a subtracting unit, for generating a difference according to the detected temperature signal and a predetermined RF temperature; and
    a weighting unit, coupled to the subtracting unit, for generating a weighted difference according to the difference;
    wherein the automatic level controller adjusts the transmitting power according to the weighted difference.

6. The transmitting power level controller of claim 1 wherein the automatic level controller adjusts the transmitting power by adjusting a baseband gain of the communication system in fractional dB and adjusting a radio frequency gain of the communication system in integral dB.

7. The transmitting power level controller of claim 1 further comprising:
    a comparator, for comparing the maximal transmitting power and a threshold to generate a comparison result;
    a multiplexer (MUX), coupled to the comparator, the temperature sensor and the power detector, for selectively outputting the detected power signal or the detected temperature signal as an output signal according to the comparison result;
    a programmable gain amplifier (PGA), coupled to the MUX, for amplifying the output signal to generate an amplified output signal;
    an analog-to-digital converter (ADC), coupled to the PGA, for converting the amplified output signal to a digital output signal;
    an accumulator, coupled to the ADC, for generating an accumulation signal by accumulating the digital output signal; and
    a look-up table, coupled to the accumulator, for converting the accumulation signal to a measured temperature or a measured power;
    wherein the automatic level controller adjusts the transmitting power according to the measured temperature or the measured power.

8. The transmitting power level controller of claim 7 wherein the look-up table converts the accumulation signal to the measured power according to the detected temperature signal.

9. The transmitting power level controller of claim 1 wherein the power detector further comprises a low pass filter for filtering out high frequency components of the detected power signal.

10. The transmitting power level controller of claim 1 wherein the power level control calculates the maximal transmitting power according to a symbol having maximal power in a frame of the communication signal, and the power level control calculates the maximal transmitting power frame by frame.

11. The transmitting power level controller of claim 1 wherein the transmitting automatic level controller generates the maximal transmitting power and the detected temperature signal at a first frame of the communication signal and adjusts the transmitting power at a second frame of the communication signal, the second frame being next to the first frame.

12. A method for adjusting transmitting power level of a communication system, wherein the communication system comprises a radio-frequency (RF) unit for generating a communication signal and a power amplifier (PA) for amplifying the communication signal to generate a transmitting signal, the method comprising:
   sensing temperature of at least one of the RF unit and the PA to generate a detected temperature signal;
   detecting a transmitting power of the transmitting signal to generate a detected power signal; and
   adjusting the transmitting power of the transmitting signal according to the detected power signal when a maximal transmitting power is in a predetermined range, and adjusting the transmitting power according to the detected temperature signal when the maximal transmitting power is not in the predetermined range.

13. The method of claim 12 further comprising:
   generating a difference according to the detected power signal and the transmitting power; and
   generating a weighted difference according to the difference; and
   adjusting the transmitting power according to the weighted difference.

14. The method of claim 13 further comprising:
   generating an average difference according to the weighted difference; and
   adjusting the transmitting power according to the average difference.

15. The method of claim 12 further comprising:
   sensing temperature of the PA to generate the detected temperature signal;
   generating a difference according to the detected temperature signal and a predetermined PA temperature;
   generating a weighted difference according to the difference; and
   adjusting the transmitting power according to the weighted difference.

16. The method of claim 12 wherein the temperature sensor senses temperature of the RF unit, and the automatic level controller comprises:
   sensing temperature of the RF unit to generate the detected temperature signal;
   generating a difference according to the detected temperature signal and a predetermined RF temperature;
   generating a weighted difference according to the difference; and
   adjusting the transmitting power according to the weighted difference.

17. The method of claim 12 further comprising:
   adjusting the transmitting power by adjusting a baseband gain of the communication system in fractional dB and adjusting a radio frequency gain of the communication system in integral dB.

18. The method of claim 12 further comprising:
   calculating the maximal transmitting power according to a symbol having maximal power in a frame of the communication signal frame; and calculating the maximal transmitting power frame by frame.

19. The method of claim 12 further comprising:
   generating the maximal transmitting power and the detected temperature signal at a first frame of the communication signal; and
   adjusting the transmitting power at a second frame of the communication signal, the second frame being next to the first frame.

20. A transmitting power level controller of a communication system, the communication system comprising a radio-frequency (RF) unit for generating a communication signal and a power amplifier (PA) for amplifying the communication signal to generate a transmitting signal, the transmitting power level controller comprising:
   a temperature sensor, for sensing temperature of at least one of the RF unit and the PA to generate a detected temperature signal;
   a power detector, for detecting a transmitting power of the transmit signal to generate a detected power signal; and
   an automatic level controller, coupled to the temperature sensor and the power detector, for adjusting the transmitting power of the transmitting signal according to the detected power signal when a maximal transmitting power is in a predetermined range, and adjusting the transmitting power according to the detected temperature signal otherwise, and the automatic level controller comprises a power setting unit comprising:
      a subtracting unit, for generating a difference according to the detected power signal and a target transmitting power;
      a weighting unit, coupled to the subtracting unit, for generating a weighted difference according to the difference; and
      an average unit, coupled to the weighting unit, for generating an average difference according to an output signal of the weighting unit
      wherein the automatic level controller adjusts the transmitting power according to the average difference.

21. A transmitting power level controller of a communication system, the communication system comprising a radio-frequency (RF) unit for generating a communication signal and a power amplifier (PA) for amplifying the communication signal to generate a transmitting signal, the transmitting power level controller comprising:
   a temperature sensor, for sensing temperature of at least one of the RF unit and the PA to generate a detected temperature signal;
   a power detector, for detecting a transmitting power of the transmit signal to generate a detected power signal;
   an automatic level controller, coupled to the temperature sensor and the power detector, for adjusting the transmitting power of the transmitting signal according to the detected power signal when a maximal transmitting power is in a predetermined range, and adjusting the transmitting power according to the detected temperature signal otherwise;
   a comparator, for comparing the maximal transmitting power and a threshold to generate a comparison result;
   a multiplexer (MUX), coupled to the comparator, the temperature sensor and the power detector, for selectively outputting the detected power signal or the detected temperature signal as an output signal according to the comparison result;
   a programmable gain amplifier (PGA), coupled to the MUX, for amplifying the output signal to generate an amplified output signal;
   an analog-to-digital converter (ADC), coupled to the PGA, for converting the amplified output signal to a digital output signal;
   an accumulator, coupled to the ADC, for generating an accumulation signal by accumulating the digital output signal; and
   a look-up table, coupled to the accumulator, for converting the accumulation signal to a measured temperature or a measured power;

wherein the automatic level controller adjusts the transmitting power according to the measured temperature or the measured power.

22. A method for adjusting transmitting power level of a communication system, wherein the communication system comprises a radio-frequency (RF) unit for generating a communication signal and a power amplifier (PA) for amplifying the communication signal to generate a transmitting signal, the method comprising:

sensing temperature of at least one of the RF unit and the PA to generate a detected temperature signal;

detecting a transmitting power of the transmitting signal to generate a detected power signal;

adjusting the transmitting power of the transmitting signal according to the detected power signal when a maximal transmitting power is in a predetermined range, and adjusting the transmitting power according to the detected temperature signal otherwise;

generating a difference according to the detected power signal and the transmitting power;

generating a weighted difference according to the difference;

generating an average difference according to the weighted difference; and adjusting the transmitting power according to the average difference.

* * * * *